United States Patent
Sills

(10) Patent No.: US 8,536,562 B2
(45) Date of Patent: Sep. 17, 2013

(54) METHODS OF FORMING MEMORY STRUCTURES AND METHODS OF FORMING MEMORY ARRAYS

(75) Inventor: Scott E. Sills, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 13/402,535

(22) Filed: Feb. 22, 2012

(65) Prior Publication Data

US 2013/0214230 A1 Aug. 22, 2013

(51) Int. Cl.
*H01L 29/06* (2006.01)
*H01L 21/8242* (2006.01)

(52) U.S. Cl.
USPC ............. 257/5; 257/1; 257/2; 257/3; 257/4; 257/E45.001; 257/E42.002; 257/E45.003; 257/E45.004; 365/148; 365/163

(58) Field of Classification Search
USPC .......... 257/1–5, E45.001–E45.004; 365/148, 365/163
See application file for complete search history.

(56) References Cited

U.S. PATENT DOCUMENTS

| 7,560,723 B2* | 7/2009 | Liu | 257/5 |
| 2007/0232015 A1* | 10/2007 | Liu | 438/396 |
| 2008/0068879 A1 | 3/2008 | Ahn et al. | |
| 2009/0026618 A1 | 1/2009 | Kim et al. | |
| 2010/0093130 A1 | 4/2010 | Oh et al. | |

OTHER PUBLICATIONS

U.S. Appl. No. 13/359,715, filed Jan. 27, 2012 by Inventor Gurtej S. Sandhu et al.

* cited by examiner

*Primary Examiner* — Matthew W Such
*Assistant Examiner* — David Spalla
(74) *Attorney, Agent, or Firm* — Wells St. John P.S.

(57) ABSTRACT

Some embodiments include methods of forming memory structures. An electrically insulative line is formed over a base. Electrode material is deposited over the line and patterned to form a pair of bottom electrodes along the sidewalls of the line. Programmable material is formed over the bottom electrodes, and a top electrode is formed over the programmable material. The bottom electrodes may each contain at least one segment which extends at angle of from greater than 0° to less than or equal to about 90° relative to a planar topography of the base. Some embodiments include memory structures having a bottom electrode extending upwardly from a conductive contact to a programmable material, with the bottom electrode having a thickness of less than or equal to about 10 nanometers. Some embodiments include memory arrays and methods of forming memory arrays.

17 Claims, 9 Drawing Sheets

US 8,536,562 B2

METHODS OF FORMING MEMORY STRUCTURES AND METHODS OF FORMING MEMORY ARRAYS

TECHNICAL FIELD

Memory structures, memory arrays, methods of forming memory structures and methods of forming memory arrays.

BACKGROUND

Memory is one type of integrated circuitry, and is used in computer systems for storing data. Integrated memory is usually fabricated in one or more arrays of individual memory cells. The memory cells are configured to retain or store memory in at least two different selectable states. In a binary system, the states are considered as either a "0" or a "1". In other systems, at least some individual memory cells may be configured to store more than two levels or states of information.

There is a continuing goal to develop improved memory architectures; such as, for example, memory architectures that can be cheaper and/or faster to manufacture, memory architectures with faster refresh, and/or less volatility, and/or faster programming speed, and/or greater scalability, etc.

It is desired to develop improved memory architectures, and to develop methods of forming such architectures.

DETAILED DESCRIPTION OF THE ILLUSTRATED EMBODIMENTS

Some embodiments include methods of forming memory structures in which bottom electrodes of memory structures are formed along an electrically insulative line. Such may enable bottom electrode material to be deposited as a thin layer, and may enable the bottom electrodes to be formed at any desired angle relative to an underlying base. Some embodiments include memory cells having thin bottom electrodes. Some embodiments include memory arrays. Example embodiments are described with reference to FIGS. 1-16.

Figure 1:
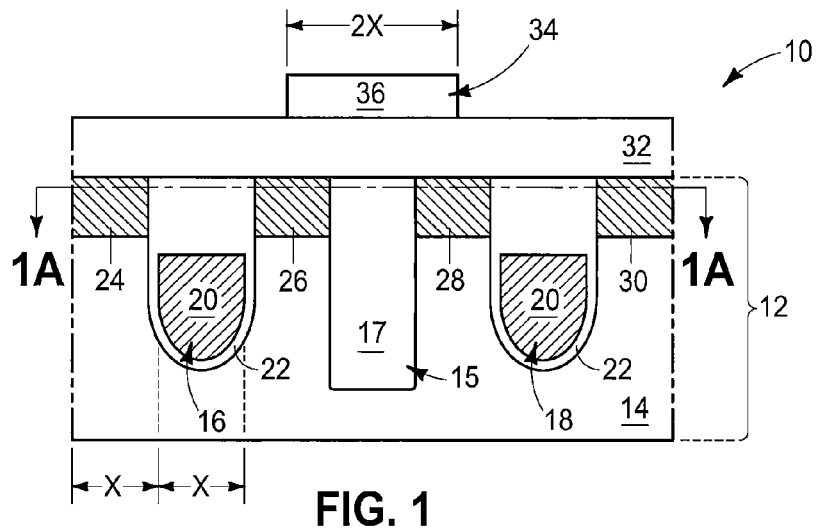
FIGS. 1-7 are diagrammatic cross-sectional views of a portion of a semiconductor construction at various process stages of an example embodiment method.

Referring to FIG. 1, a semiconductor construction 10 comprises a base 12 comprising semiconductor material 14. Base 12 may be referred to as a semiconductor substrate, or as a portion of a semiconductor substrate. The terms "semiconductive substrate," "semiconductor construction" and "semiconductor substrate" mean any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductive substrates described above. Base 12 may correspond to a semiconductor substrate containing one or more materials associated with integrated circuit fabrication in some embodiments. Some of the materials may be under the shown region of the base and/or may be laterally adjacent the shown region of the base; and may correspond to, for example, one or more of refractory metal materials, barrier materials, diffusion materials, insulator materials, etc.

Semiconductor material 14 may comprise any suitable semiconductor material; and in some embodiments may comprise, consist essentially of, or consist of monocrystalline silicon.

An isolation region 15 extends into semiconductor material 14. The isolation region comprises electrically insulative material 17. Such electrically insulative material may comprise any suitable composition or combination of compositions; and in some embodiments may comprise one or more of silicon nitride, silicon dioxide, silicon oxynitride, etc.

Buried wordlines 16 and 18 are within semiconductor material 14 and on opposing sides of isolation region 15 relative to one another. The wordlines comprise electrically conductive material 20. Such material may be any suitable electrically conductive composition or combination of compositions; and in some embodiments may comprise, consist essentially of, or consist of one or more of various metals (for instance, copper, tungsten, titanium, etc.), metal-containing compositions (for instance, metal silicides, metal nitrides, metal carbide, etc.) and conductively-doped semiconductor materials (for instance, conductively-doped silicon, conductively-doped germanium, etc.). The wordlines 16 and 18 extend in and out of the page relative to the shown cross-sectional view.

The wordlines 16 and 18 are at least partially surrounded by dielectric material 22. The dielectric material may comprise any suitable composition or combination of compositions; and in some embodiments may comprise, consist essentially of, or consist of one or more of silicon dioxide, silicon nitride, hafnium oxide, zirconium oxide, etc. At least some of material 22 may function as gate dielectric for spacing a transistor gate region of a wordline from a channel region. In some embodiments, the portion of the dielectric material 22 which is over the wordlines may be compositionally different from the portion which is along the sides and bottoms of the wordlines.

Figure 1A:
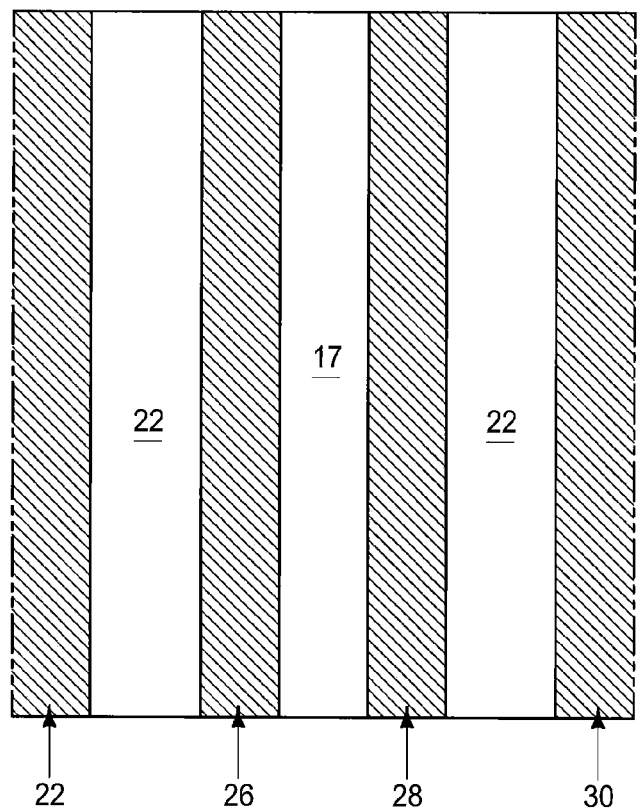
FIG. 1A is diagrammatic view of a section along the line 1A-1A of FIG. 1.

Conductively-doped regions 24 and 26 are provided adjacent wordline 16, and conductively-doped regions 28 and 30 are provided adjacent wordline 18. The regions 24, 26, 28 and 30 are electrically conductive strips extending in and out of the page relative to the cross-sectional view of FIG. 1. Such is illustrated in FIG. 1A, which shows a view along the line 1A-1A of FIG. 1.

Although regions 24, 26, 28 and 30 are illustrated to be conductively-doped regions within semiconductor material 14, in other embodiments other electrically conductive materials may be utilized either in addition to the shown conductively-doped regions or alternatively to the shown conductively-doped regions. For instance, in some embodiments one or more metals or metal-containing compounds may be provided over upper surfaces of the conductively-doped regions to enhance electrical coupling between the conductively-doped regions and subsequently-formed electrodes (example electrodes are described below with reference to FIG. 5). Accordingly, the regions 24, 26, 28 and 30 may be referred to as electrical contact regions in some embodiments to indicate that such regions may comprise any suitable electrically conductive material, including, but not limited to, the illustrated conductive implant regions. In embodiments in which regions 24, 26, 28 and 30 are referred to as contact regions, the electrically conductive strips shown in FIG. 1A may be referred to as electrical contact strips.

An electrically insulative material 32 is provided over base 12. The electrically insulative material may comprise any suitable composition; and in some embodiments may comprise, consist essentially of, or consist of one or both of silicon nitride and silicon dioxide.

A patterned feature 34 of masking material 36 is formed over the electrically insulative material 32. The masking material may comprise any suitable composition or combination of compositions; and in some embodiments may comprise photolithographically-patterned photoresist.

In the shown embodiment of FIG. 1, the various structures formed within base 12 are illustrated to have widths of about x, and the patterned feature 34 is shown having a width of about 2x. In some embodiments, the structures formed within base 12 may be patterned with pattern density-multiplication methodologies (such as pattern density-doubling methodologies), and the feature 34 may be photolithographically-patterned photoresist. Accordingly, the structures formed within the base may have smaller dimensions along the cross-section of FIG. 1 than the feature 34.

Figure 2:
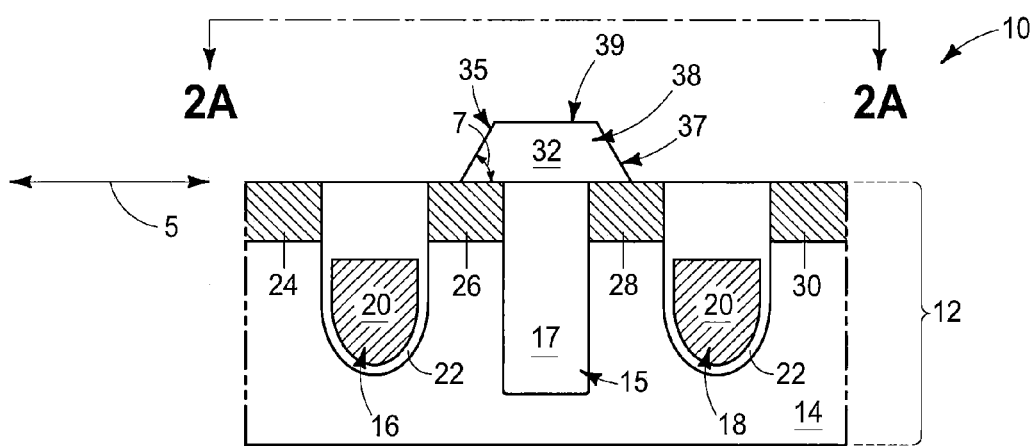
Figure 2A:
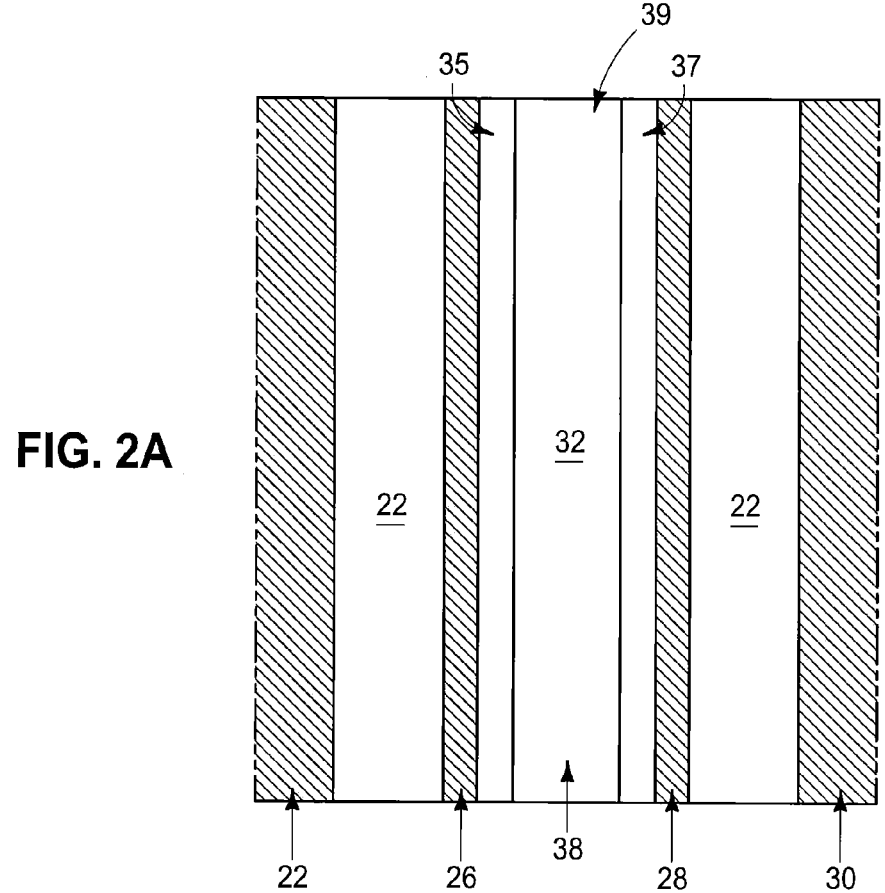
FIG. 2A is diagrammatic view top view of the construction of FIG. 2.

Referring to FIG. 2, the electrically insulative material 32 is etched while using feature 34 (FIG. 1) as a mask, and then feature 34 is removed. Material 32 is thus patterned into a line 38 extending along an upper surface of base 12. Such line extends in and out of the page relative to the cross-section of FIG. 2; as shown in the top view of FIG. 2A.

At least some of the etching of insulative material 32 occurs while feature 34 (FIG. 1) is present, and thus line 38 is formed in a location defined by the feature 34. However, some of the etching may also occur after removal of feature 34. Regardless, a desired shape is imparted to line 32 through the choice of etching conditions (for instance, the amount of chemical etching relative to physical etching, which may be varied during the duration of the etch in some embodiments) and/or through the timing of removal of feature 34. The line 32 has sidewalls 35 and 37 at opposing sides of the line relative to one another. In some embodiments, the sidewalls 35 and 37 may be referred to as a first sidewall and a second sidewall, respectively. The sidewalls extend from an upper surface of base 12 to a top surface 39 of the line 38.

The first sidewall 35 is directly over an upper surface of electrical contact region 26, and the second sidewall is directly over an upper surface of electrical contact region 28. In the shown embodiment, the sidewalls 35 and 37 are angled relative to the upper surface of base 12. Specifically, base 12 may be considered to have a planar topography extending along a direction 5, and the sidewalls are angled relative to such planar topography. The term "planar topography" refers to the overall planar topography of the upper surface of base 12 rather than to a specific feature. In some embodiments, the upper surface of the base may be planar and the primary upper surface will be readily recognized as being the same as the planar topography. In other embodiments, the upper surface of base 12 may have undulations and/or other surface features such that the upper surface is not planar, but persons of ordinary skill in the art will understand that there may be an overall planar topography associated with the base regardless of whether or not the upper surface is itself absolutely planar.

Figure 13:
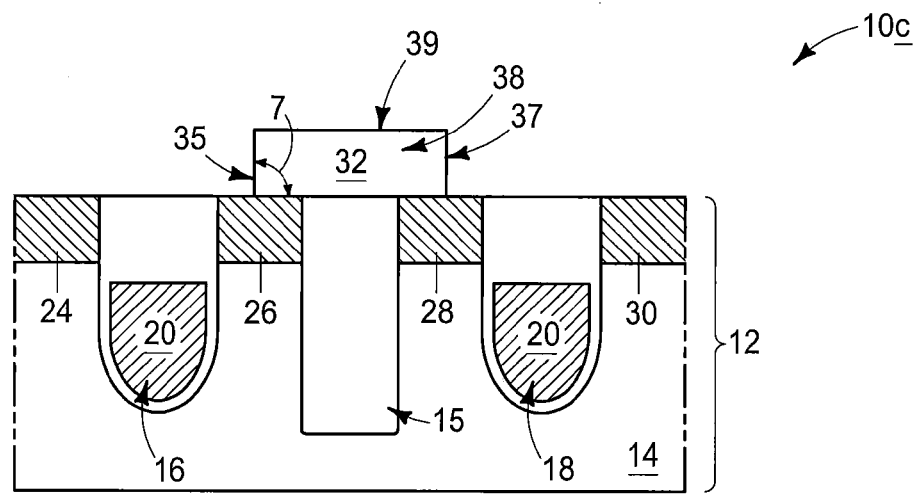
FIGS. 13 and 14 are diagrammatic cross-sectional views of a portion of a semiconductor construction at various process stages of another example embodiment method.

The sidewalls may be at any desired angle relative to the planar topography of base 12, and in some embodiments may be vertical relative to such planar topography (as described below with reference to FIGS. 13 and 14). Although FIG. 2 shows the angled sidewalls having a single segment between the upper surface of base 12 and the top surface 39 of line 38, in other embodiments the sidewalls may have multiple segments (as described below with reference to FIGS. 15 and 16).

The illustrated sidewall 35 is formed at an angle 7 relative to the planar topography of base 12. In some example embodiments, such angle may be from greater than 0° to less than or equal to about 90°. In some example embodiments, the angle 7 may be within a range of from greater than 30° to less than or equal to about 85°; and in some example embodiments or may be within a range from greater than or equal to about 45° to less than or equal to about 60°.

Figure 3:
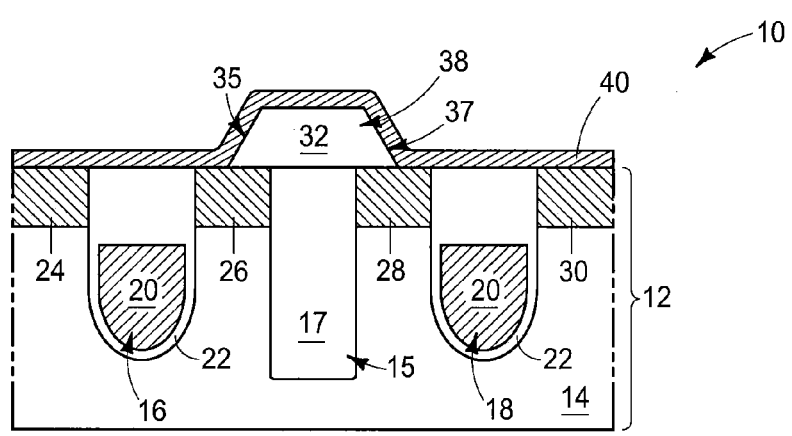

Referring to FIG. 3, electrode material 40 is deposited over line 38 and along the sidewalls 35 and 37. The electrode material may comprise any suitable composition or combination of compositions; and in some embodiments may comprise, consist essentially of, or consist of one or more of various metals, metal-containing materials, and conductively-doped semiconductor materials. For instance, the electrode material may comprise, consist essentially of, or consist of titanium nitride. The electrode material may be formed utilizing any suitable processing, and in some embodiments may be deposited utilizing one or more of atomic layer deposition (ALD), chemical vapor deposition (CVD) and physical vapor deposition (PVD). It may be desired that material 40 be formed very thin so that electrodes patterned from material 40 form extremely small contact areas with subsequent memory cell layer(s). The utilization of thin electrodes may improve scalability and/or may reduce costs associated with the utilization of the electrode material. In some embodiments, the electrode material may be deposited utilizing ALD and may be formed to a thickness of less than or equal to about 10 nanometers. In some embodiments, the electrode material may be formed to a thickness of less than or equal to about 5 nanometers, or less than or equal to about 3 nanometers. In some embodiments, the electrode material may be formed to a thickness within a range of from about 1 nanometer to about 5 nanometers.

Figure 4:
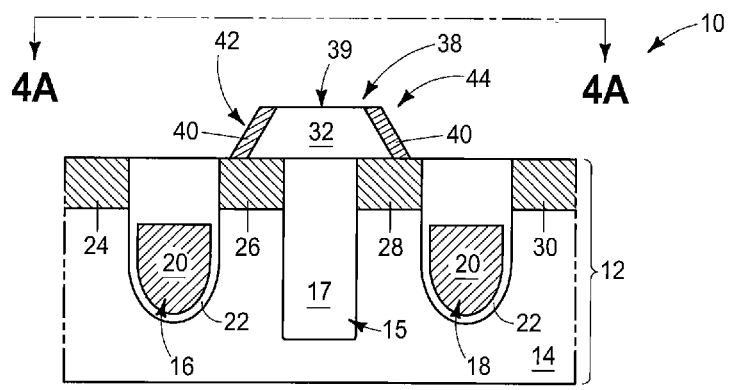

Referring to FIG. 4, the electrode material 40 is patterned to remove the electrode material from over an upper surface of base 12, while leaving the electrode material along sidewalls 35 and 37. The remaining electrode material is patterned into a first conductive runner 42 along the sidewall 35, and a second conductive runner 44 along the sidewall 37. In some embodiments, the patterning of the electrode material may comprise an anisotropic etch which removes the electrode material from over the upper surface of base 12 and the top surface 39 of line 38 while leaving the conductive runners along the sidewalls 35 and 37. In other embodiments, a patterned mask may be provided to cover some of the electrode material, exposed regions of the electrode material may be removed with one or more suitable etches, and subsequently the patterned mask may be removed. In embodiments which utilize such patterned mask, there may be electrode material remaining over the top surface 39 at the processing stage of FIG. 4 so that the runners are part of a single conductive expanse extending over the top 39 as well as along the sidewalls 35 and 37. In such embodiments, the portion of electrode material 40 remaining over the top 39 may be removed at a subsequent planarization step (discussed below with reference to FIG. 6) to separate the runners from one another.

It may be desirable to utilize the anisotropic etch for forming conductive runners of material 40 when the sidewalls 35 and 37 are at a steep enough angle relative to the upper surface of base 12 for such etch to be effective, and to utilize the patterned mask during the etching of conductive material 40 in embodiments in which sidewalls 35 and 37 are at an angle which is too shallow for effective utilization of the anisotropic etch.

Figure 4A:
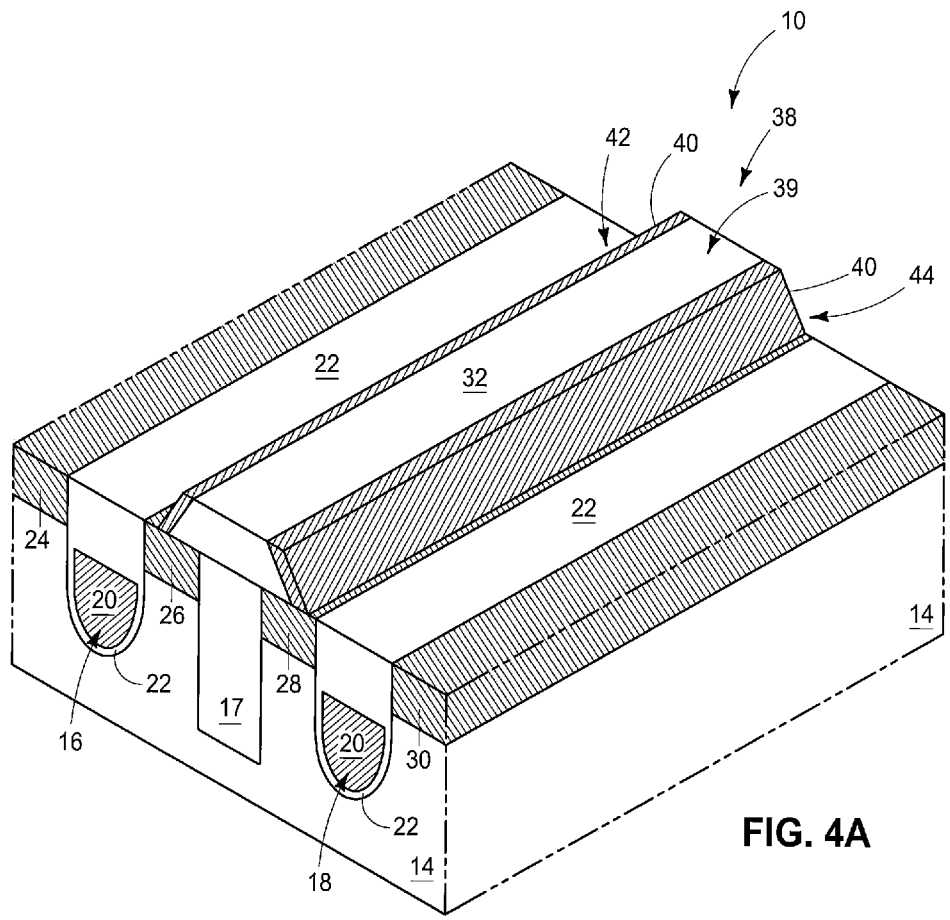
FIG. 4A is diagrammatic view top view of the construction of FIG. 4.
Figure 5:
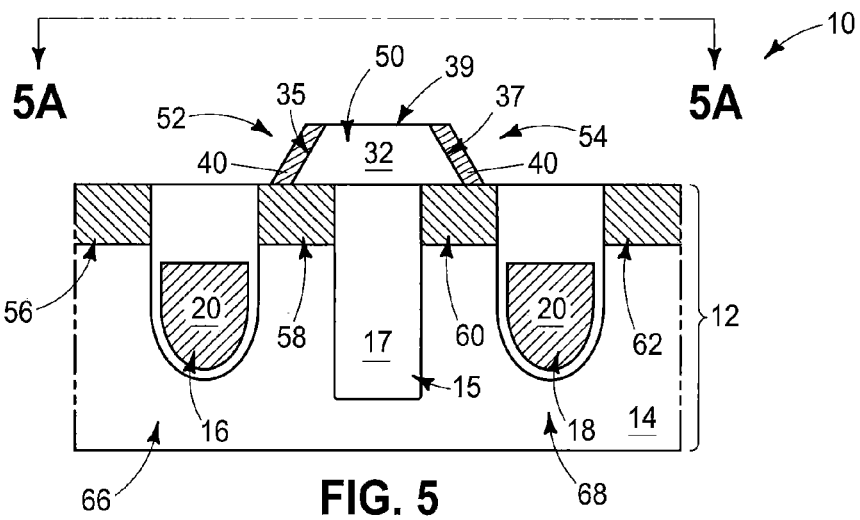
Figure 5A:
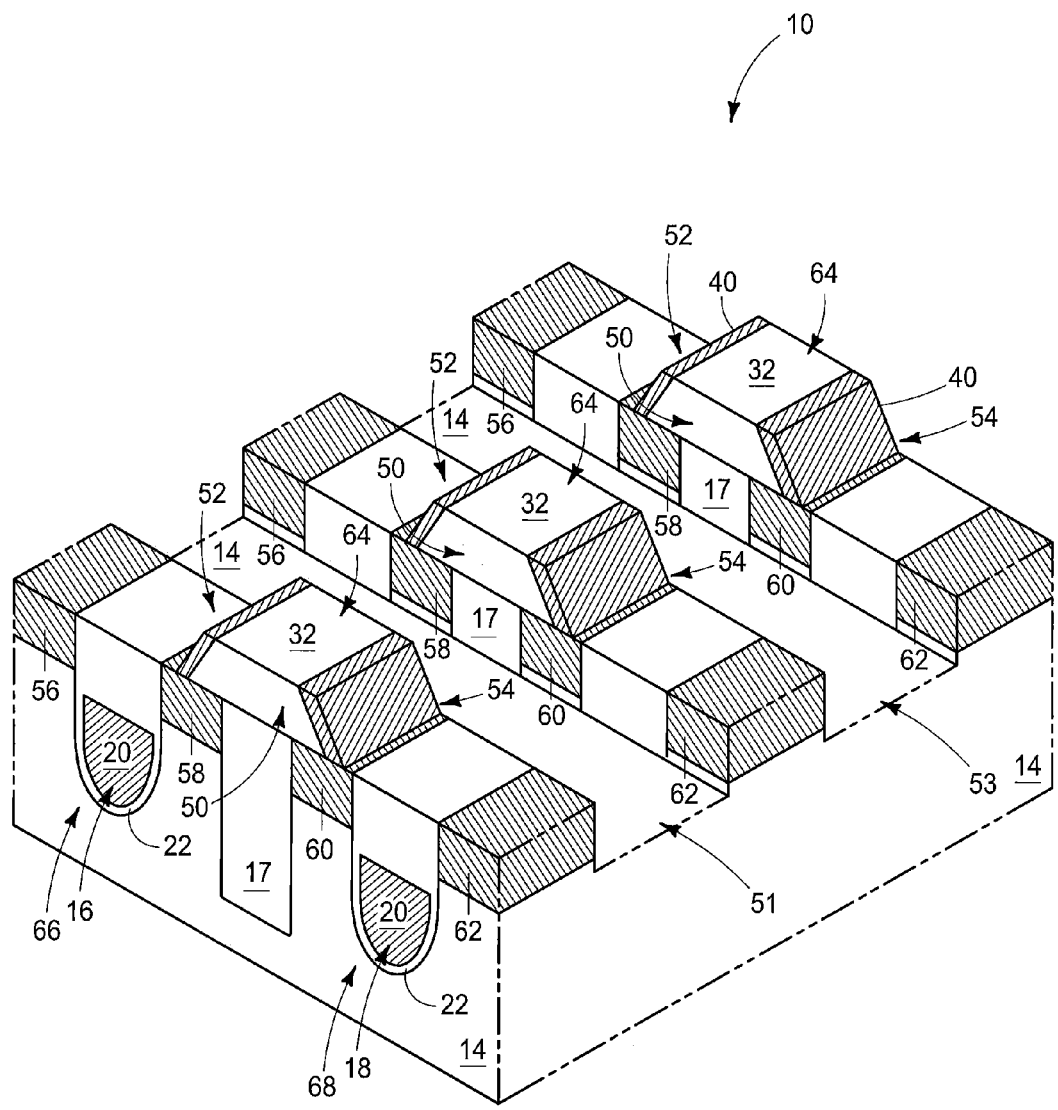
FIG. 5A is diagrammatic three-dimensional view of the construction of FIG. 5.

Referring to FIGS. 5 and 5A, an upper portion of construction 10 is patterned (i.e., chopped) into a plurality of slices. Such patterning may be accomplished utilizing any suitable processing. For instance, a patterned mask (not shown) may be formed over construction 10 to protect some regions of the construction while leaving other regions exposed, one or more suitable etches may be utilized to etch into the exposed regions, and then the mask may be removed to leave the construction of FIG. 5A. In the illustrated example embodiment, the patterning has formed trenches 51 and 53 within construction 10. The trenches subdivide the line 38 (FIG. 4A) and strips 24, 26, 28 and 30 (FIG. 4A) into a plurality of spaced apart features. Specifically, the line 38 is subdivided into a plurality of electrically insulative projections 50; and the strips 24, 26 to 28 and 30 are subdivided into electrical contact regions 56, 58, 60 and 62. Also, the conductive runners 42 and 44 (FIG. 4A) along sidewalls 35 and 37 are subdivided into a plurality of electrodes 52 and 54.

Paired electrode structures 64 are illustrated in FIGS. 5 and 5A. Each paired electrode structure comprises a projection 50, together with the electrodes 52 and 54 directly adjacent the projection.

The patterning of construction 10 forms transistor constructions along the wordlines; with a pair of the transistor constructions being labeled as 66 and 68. The transistor constructions 66 and 68 are shown in both FIG. 5A, and along the cross-section of FIG. 5. The transistor construction 66 comprises the electrical contact regions 56 and 58, together with a segment of wordline 16 adjacent such contact regions; and the transistor construction 68 comprises the electrical contact regions 60 and 62 together with a segment of wordline 18 adjacent such contact regions. Thus, contact regions 56, 58, 60 and 62 become source/drain regions of transistors. In the cross-section of FIG. 5, the electrode 52 is electrically coupled with the source/drain region corresponding to contact region 58, and the electrode 54 is electrically coupled with the source/drain region corresponding to contact region 60. Accordingly, each of the electrodes 52 and 54 is coupled to the source/drain region of a different transistor. In some embodiments, electrode 52 may be considered to be coupled with the source/drain region of a first transistor 66, and electrode 54 may be considered to be electrically coupled with a source/drain region of a second transistor 68. In the shown embodiment, the first and second transistors are adjacent to one another, and isolated from one another by isolation region 15. In some embodiments, region 15 may included isolated "dummy" wordlines.

Figure 6:
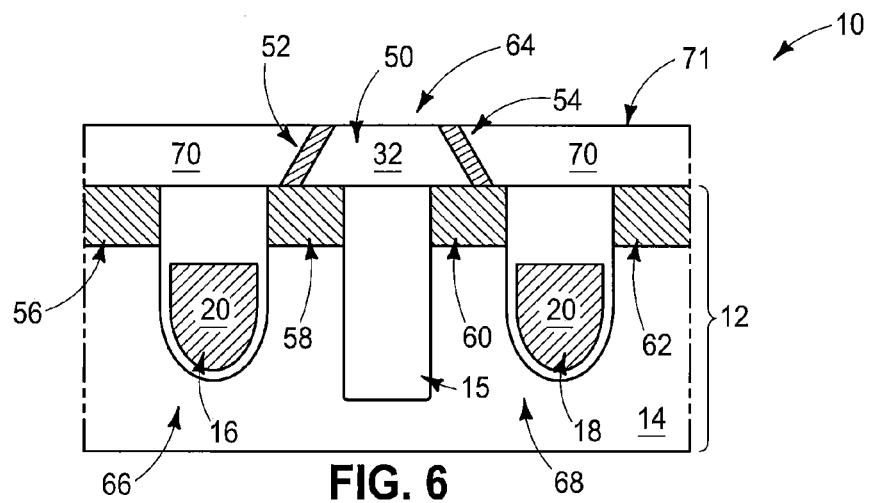

Referring to FIG. 6, construction 10 is shown at a processing stage subsequent to that of FIGS. 5 and 5A. Electrically insulative material 70 is formed across base 12 and within the trenches 51 and 53 (FIG. 5A). Construction 10 is subsequently subjected to planarization (for instance, chemical-mechanical polishing) to form a planarized upper surface 71 extending across insulative material 70, across the electrodes 52 and 54, and across the electrically insulative projection 50.

The example embodiment described with reference to FIGS. 5, 5A and 6 forms the trenches 51 and 53 of FIG. 5A prior to forming electrically insulative material 70 across base 12. In other embodiments (not shown) the electrically insulative material 70 may be first formed across base 12, and then the trenches 51 and 53 may be formed. In such embodiments, insulative material 70 may be referred to as a first electrically insulative material, and a second electrically insulative material may be formed within the trenches 51 and 53 and over the first electrically insulative. Subsequently, planarization may be conducted to form a construction analogous to that of FIG. 6. In such embodiments, the first and second electrically insulative materials may be the same composition as one another, or may be of different compositions relative to one another.

Figure 7:
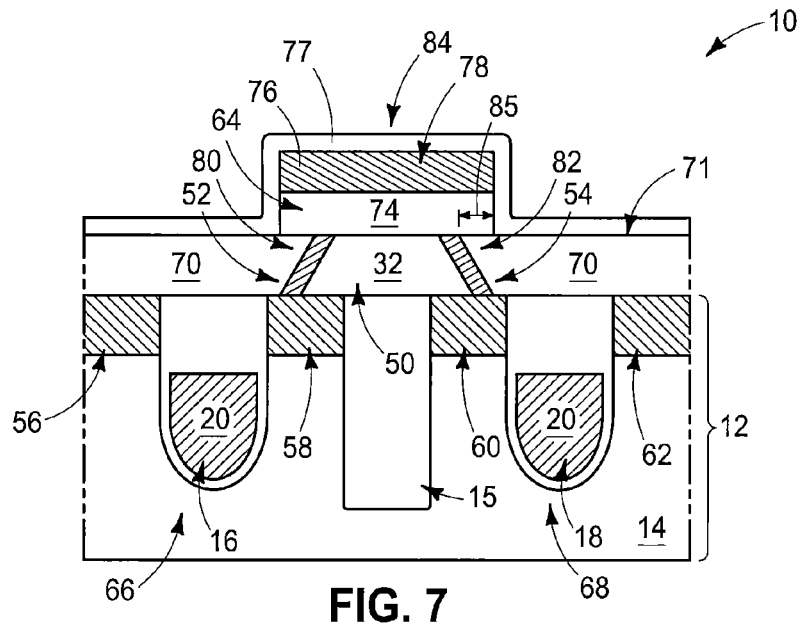

Referring to FIG. 7, programmable material 74 is formed over planar surface 71. The programmable material 74 may be a solid, gel, or any other suitable phase, may comprise any suitable composition. The programmable material may be a material traditionally associated with RRAM; such as, for example, a material utilized in programmable metallization cells (PMCs), phase change memory cells (PCMs), memristor cells, etc. In some embodiments the programmable material may comprise, consist essentially of, or consist of chalcogenide-type material (for instance, materials comprising one or more of germanium, selenium, antimony, tellurium, sulfur, copper, etc.; with example chalcogenide-type materials being $Ge_2Sb_2Te_5$, $GeS_2$, $GeSe_2$, $CuS_2$, and $CuTe$) and/or oxides such as zirconium oxide, hafnium oxide, tungsten oxide, silicon oxide (specifically, silicon dioxide), gadolinium oxide, etc. As another example, material 74 may comprise, consist essentially of, or consist of multivalent oxide containing one or more of barium, ruthenium, strontium, titanium, calcium, manganese, praseodymium, lanthanum and samarium. An example multivalent metal oxide may comprise, consist essentially of or consist of calcium manganese oxide doped with one or more of Pr, La, Sr and Sm. As yet other examples, the programmable material may comprise one or more nitrides; may comprise ion source materials (for instance, may comprise one or more of copper, silver and tellurium); switching region materials, etc.

Although the programmable material 74 is shown as a single homogeneous layer, in some embodiments the programmable material may comprise two or more discrete layers. For instance, the programmable material may comprise a multivalent metal oxide layer in combination with a high-k dielectric layer; an ion source material in combination with a switching region material; etc.

In the shown embodiment, programmable material 74 is patterned as a continuous strap extending across the electrodes 52 and 54. The programmable material may be patterned into the illustrated structure utilizing any suitable processing.

Electrically conductive material 76 is formed over programmable material 74. The electrically conductive material is patterned to form a top electrode 78. In the shown embodiment, the top electrode is patterned analogously to programmable material 74. Such may be accomplished by depositing material 76 over material 74, providing a patterned mask (not shown) over the materials, transferring a pattern from the mask to materials 74 and 76 with one or more suitable etches, and then removing the mask.

A layer of electrically insulative material 77 is provided across materials 74 and 76. In some embodiments, such layer may comprise, consist essentially of, or consist of silicon nitride.

The electrodes 52 and 54 may be considered to be bottom electrodes of a pair of memory cells. Specifically, the bottom electrode 52 together with the programmable material 74 and the top electrode 78 forms a first memory cell 80, and the bottom electrode 54 together with the programmable material 74 and the top electrode 78 forms a second memory cell 82. Accordingly, the electrodes 52 and 54, together with the programmable material 74 and the top electrode 78 may be considered to form a paired-cell structure 84 comprising a pair of RRAM cells with separate access to transistors 66 and 68.

The electrodes 52 and 54 are formed from the thin electrode material 40 described above with reference to FIG. 3. Accordingly, in some embodiments the electrodes 52 and 54 may have thicknesses of less than or equal to about 10 nanometers, less than or equal to about 5 nanometers, less than or equal to about 3 nanometers, or within a range of from about 1 nanometer to about 5 nanometers.

The programmable material has an overlap region 85 relative to a top of the electrode 54, and has a similar overlap region (not labeled) relative to the top electrode 52. An advantage of the angled electrodes 52 and 54 is that the overlap regions are larger than if the electrodes were vertical. The overlap regions provide tolerance for misalignment, in that the programmable material 74 may be misaligned relative to the underlying electrodes by distances less than or equal to the overlap region and still form functional memory cells. In some embodiments, the electrodes are angled to a sufficient degree such that the overlap regions are at least about 10 nanometers.

FIGS. 1-7 illustrate example processing for forming a paired-cell structure comprising a programmable material and a top electrode shared across two adjacent memory cells. In some embodiments, paired-cell structures identical to, or analogous to, the structure of FIG. 7 are incorporated into memory arrays. FIGS. 8-11 illustrate an example process of fabricating multiple paired-cell structures for a memory array. Identical numbering will be utilized to describe the embodiment of FIGS. 8-11 as is utilized above to describe the embodiment of FIGS. 1-7, where appropriate.

Figure 8:
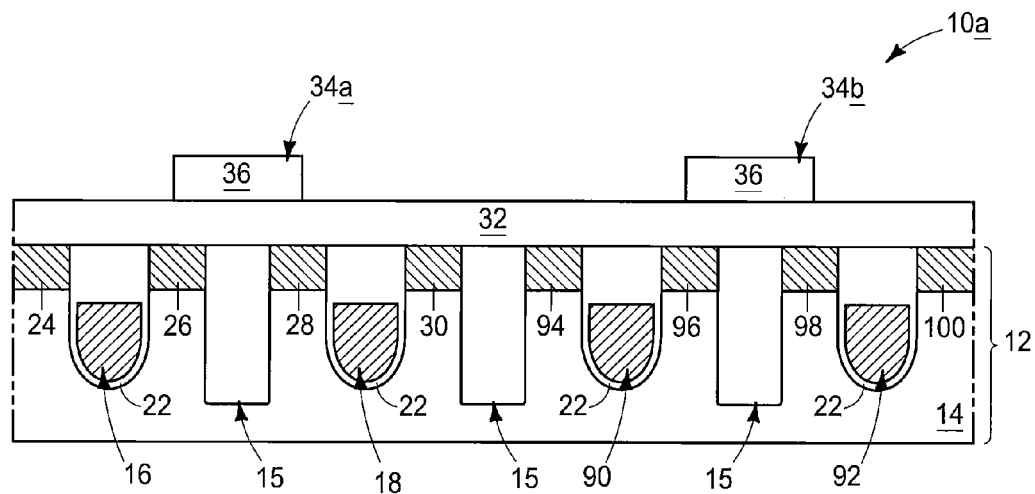
FIGS. 8-11 are diagrammatic cross-sectional views of a portion of a semiconductor construction at various process stages of another example embodiment method.

Referring to FIG. 8, a construction 10a is illustrated at a processing stage analogous to that of FIG. 1. The construction comprises buried wordlines 90 and 92 in addition to the buried wordlines 16 and 18; and comprises electrical contact strips 94, 96, 98 and 100 in addition to the strips 24, 26, 28 and 30.

The electrically insulative material 32 is over base 12, and a pair of patterned features 34a and 34b of masking material 36 are formed over the electrically insulative material 32.

Figure 9:
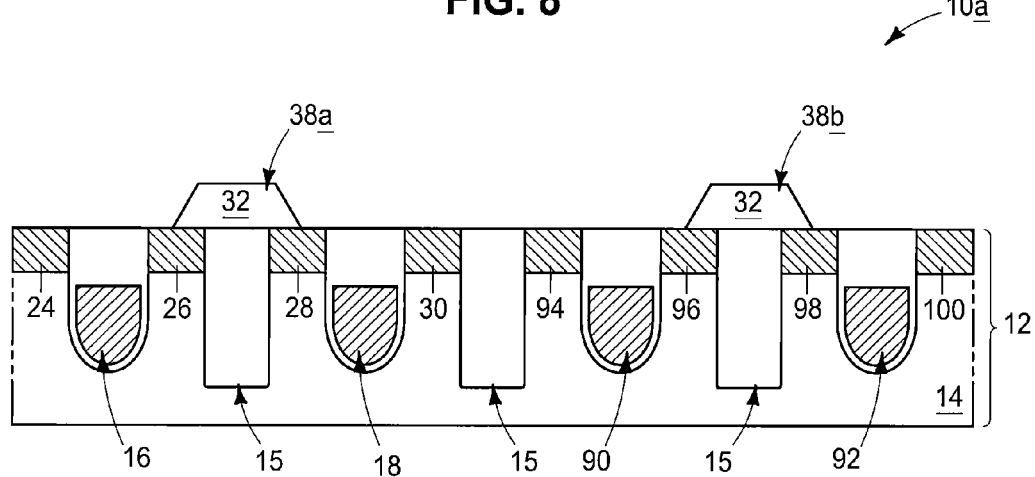

Referring to FIG. 9, the construction 10a is illustrated at a processing stage analogous to that of FIG. 2. Specifically, material 32 is patterned into a pair of lines 38a and 38b extending along an upper surface of base 12, and masking material 36 (FIG. 8) is removed. The lines 38a and 38b extend in and out of the page relative to the cross-section of FIG. 9.

Figure 10:
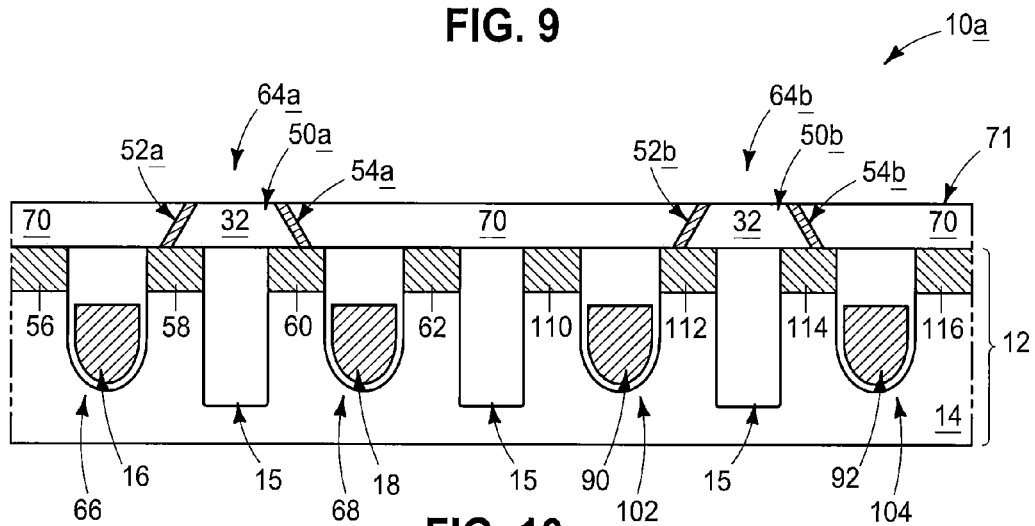

Referring to FIG. 10, the construction 10a is illustrated at a processing stage analogous to that of FIG. 6. Electrically insulative material 70 is formed across base 12, and a planarized upper surface 71 extends across insulative material 70, and across structures 64a and 64b. The structure 64a comprises bottom electrodes 52a and 54a together with an electrically insulative projection 50a, and may be referred to as a first paired-electrode structure. The structure 64b comprises bottom electrodes 52b and 54b together with an electrically insulative projection 50b, and may be referred to as a second paired-electrode structure. The paired electrode structures may be referred to as paired-bottom-electrode structures in some embodiments.

The construction 10a has been patterned to convert the electrically conductive strips 24, 26, 28, 30, 94, 96, 98 and 100 of FIG. 9 into electrical contact regions 56, 58, 60, 62, 110, 112, 114 and 116 with processing similar to that discussed above with reference to FIGS. 5 and 5A. The contact regions, together with the wordlines 16, 18, 90 and 92, form a plurality of transistor constructions; and the construction of FIG. 10 comprises transistor constructions 102 and 104 in addition to the transistor constructions 66 and 68 shown in FIG. 6.

Figure 11:
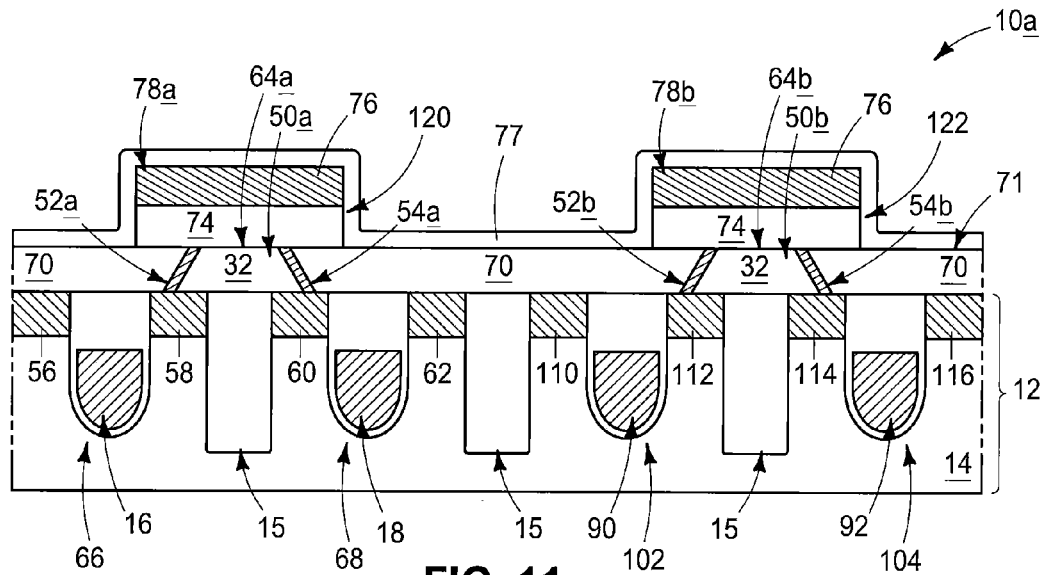

Referring to FIG. 11, the construction 10a is illustrated at a processing stage analogous to that of the construction 10 of FIG. 7. Programmable material 74 is patterned into a pair of straps 120 and 122 extending across the paired-electrode structures 64a and 64b. Each strap is against only one paired-electrode structure (i.e., the straps are in one-to-one correspondence with the paired-electrode structures), and is continuous across both bottom electrodes of the underlying paired-electrode structure.

Top electrodes 78a and 78b are formed over the programmable material straps 120 and 122, with the electrodes comprising the electrically conductive material 76. The top electrodes are in one-to-one correspondence with the programmable material straps, and with the paired-electrode structures 64a and 64b underlying such straps. The electrically insulative material 77 is deposited over and between the top electrodes of FIG. 11 in the shown embodiment.

Figure 12:
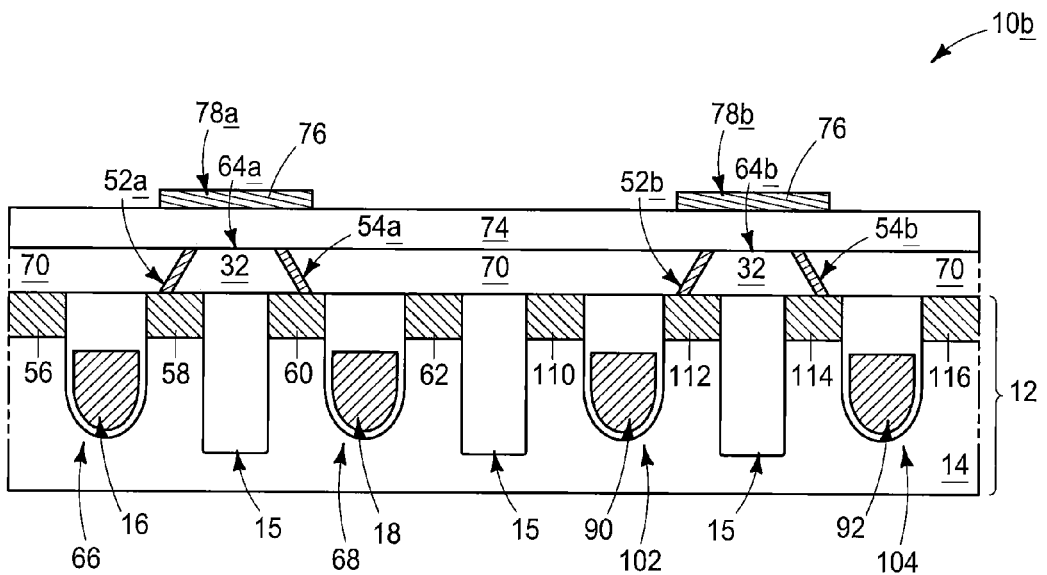
FIG. 12 is view of a processing stage alternative to that of FIG. 10 in accordance with another example method.

Although the embodiment of FIG. 11 shows the programmable material 74 formed as straps in one-to-one correspondence with the paired-electrode structures 64a and 64b, in other embodiments the programmable material may be formed as an expanse which extends across multiple paired-electrode structures. For instance, FIG. 12 shows an example construction 10b in which the programmable material 74 is a continuous expanse extending across both of the paired-electrode structures 64a and 64b. Some programmable materials may be more suitable for utilization in the construction 10b of FIG. 12 than others, as will be recognized by persons of ordinary skill.

Top electrodes 78a and 78b are formed over the programmable material 74, and are in one-to-one correspondence with the paired-bottom-electrode structures 64a and 64b. In subsequent processing (not shown), electrically insulative material may be formed over and between the top electrodes of FIG. 12.

As discussed above with reference to FIG. 2, the sidewalls 35 and 37 along the line 38 may be formed in other configurations besides the shown configuration of FIG. 2. An example embodiment comprising another configuration of such sidewalls is described with reference to FIGS. 13 and 14. FIG. 13 shows a construction 10c at a processing stage analogous to that described above with reference to FIG. 2. The construction of FIG. 13 is identical to that of FIG. 2, except that sidewalls 35 and 37 are substantially orthogonal to the upper surface of base 12 (i.e., angle 7 is about 90°). FIG. 14 shows construction 10c at a processing stage analogous to that of FIG. 7. The construction of FIG. 14 is substantially identical to that of FIG. 7, except that the bottom electrodes 52 and 54 are substantially orthogonal to the planar topography of base 12.

Figure 14:
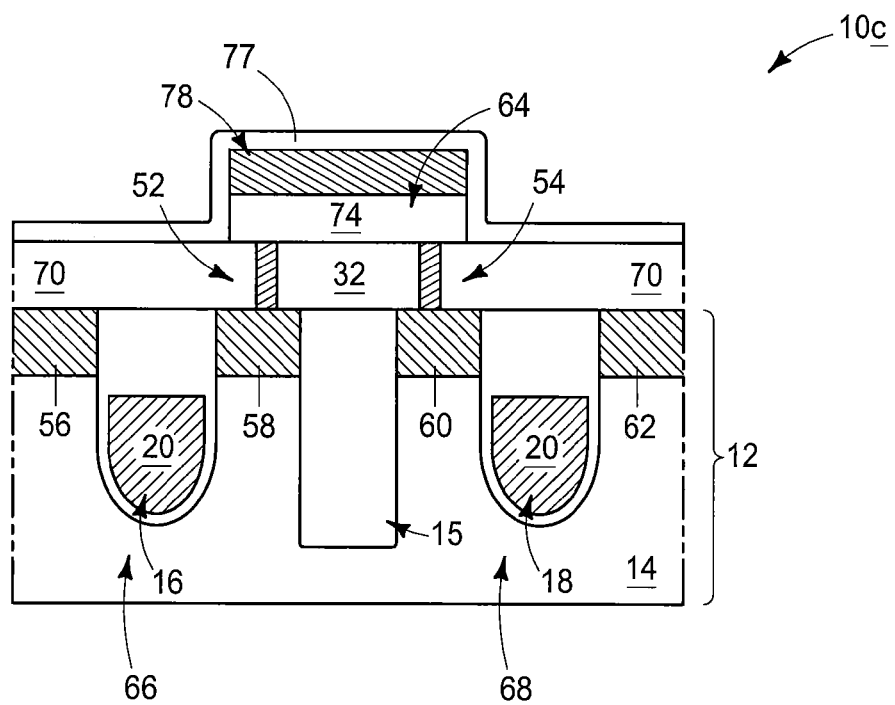

In some embodiments, the electrodes 52 and 54 of FIG. 14 may be formed with processing analogous to that described above with reference to FIGS. 3-7, and thus may be formed from the thin electrode material 40 described above with reference to FIG. 3. Accordingly, in some embodiments the electrodes 52 and 54 may have thicknesses of less than or equal to about 10 nanometers, less than or equal to about 5 nanometers, less than or equal to about 3 nanometers, or within a range of from about 1 nanometer to about 5 nanometers.

Figure 15:
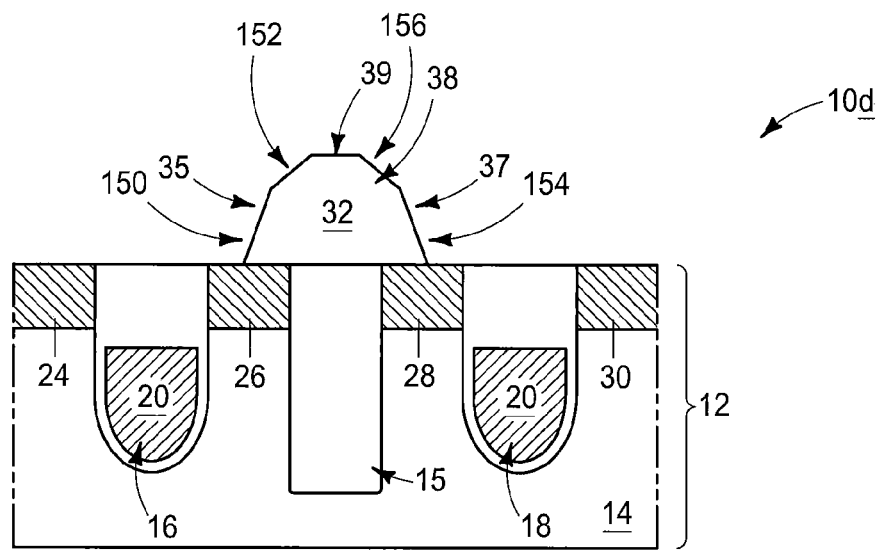
FIGS. 15 and 16 are diagrammatic cross-sectional views of a portion of a semiconductor construction at various process stages of another example embodiment method.
Figure 16:
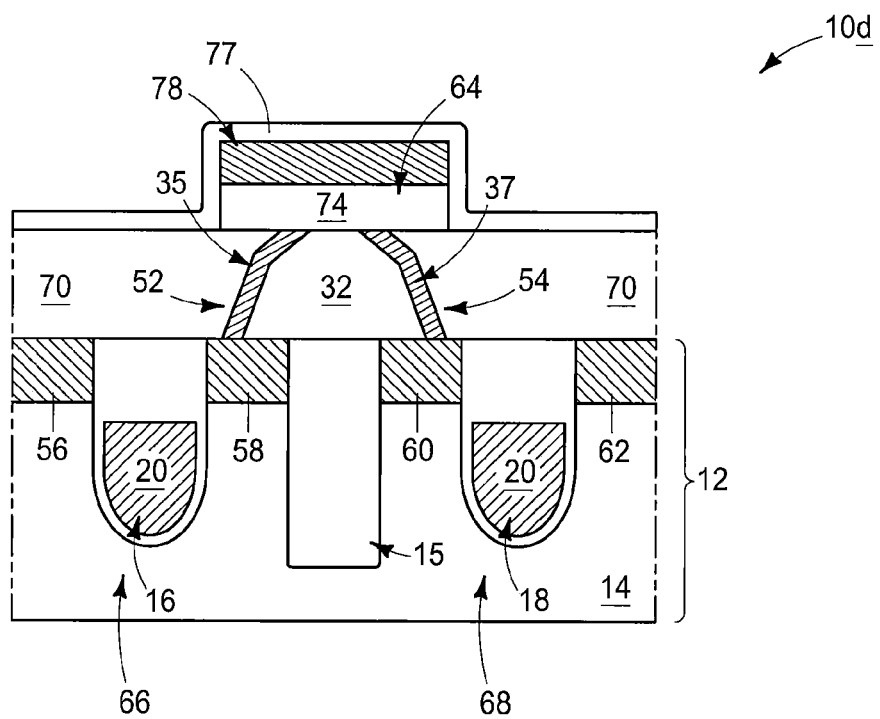

FIGS. 15 and 16 show another example embodiment method of forming memory cells. FIG. 15 shows a construction 10d at a processing stage analogous to that described above with reference to FIG. 2. The construction of FIG. 15 is identical to that of FIG. 2, except that each of the sidewalls 35 and 37 comprises two angled segments between the planar topography of base 12 and the top 39 of the line. The segments of sidewall 35 are labeled as a bottom segment 150 and a top segment 152, and the segments of sidewall 37 are labeled as a bottom segment 154 and a top segment 156. The angles between the bottom segments and the planar topography of base 12, and between the top and bottom segments relative to one another, may be any suitable angles; and may be formed by, for example, varying the ratio of chemical to physical etching while patterning the material 32. Although each sidewall is shown to comprise two segments, in other embodiments the sidewalls may comprise more than two segments. Also, although the illustrated segments are straight, in other embodiments one or more of the segments may be curved.

FIG. 16 shows construction 10d at a processing stage analogous to that of FIG. 7. The construction of FIG. 16 is substantially identical to that of FIG. 7, except that the bottom electrodes 52 and 54 comprise multiple angled segments complementary to the segmented shapes of sidewalls 35 and 37.

In some embodiments, the electrodes 52 and 54 of FIG. 16 may be formed with processing analogous to that described above with reference to FIGS. 3-7, and thus may be formed from the thin electrode material 40 described above with reference to FIG. 3. Accordingly, in some embodiments the electrodes 52 and 54 of FIG. 16 may have thicknesses of less than or equal to about 10 nanometers, less than or equal to about 5 nanometers, less than or equal to about 3 nanometers, or within a range of from about 1 nanometer to about 5 nanometers.

In some embodiments (not shown), processing analogous to that of FIGS. 1-16 may be utilized to form DRAM cells. For instance, the electrodes 52 and 54 of FIG. 14 may be electrically coupled to storage nodes of DRAM capacitors (or may be electrically coupled to other charge storage devices), instead of contacting the programmable material 74. In some example embodiments, the electrodes 52 and 54 may be electrically coupled to container-shaped storage nodes of DRAM capacitors.

The memory structures and arrays discussed above may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, clocks, televisions, cell phones, personal computers, automobiles, industrial control systems, aircraft, etc.

The particular orientation of the various embodiments in the drawings is for illustrative purposes only, and the embodiments may be rotated relative to the shown orientations in some applications. The description provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections in order to simplify the drawings.

When a structure is referred to above as being "on" or "against" another structure, it can be directly on the other structure or intervening structures may also be present. In contrast, when a structure is referred to as being "directly on" or "directly against" another structure, there are no intervening structures present. When a structure is referred to as being "connected" or "coupled" to another structure, it can be directly connected or coupled to the other structure, or intervening structures may be present. In contrast, when a structure is referred to as being "directly connected" or "directly coupled" to another structure, there are no intervening structures present.

In some embodiments, the invention includes a method of forming a plurality of memory structures. A line of electrically insulative material is formed over a base. The line has a first sidewall in opposing relation to a second sidewall. The base has a plurality of spaced-apart electrical contact regions along an upper surface. The first sidewall is directly over an upper surface of a first electrical contact region and the second sidewall is directly over a second electrical contact region. Electrode material is deposited over the line and along the sidewalls. The electrode material is patterned to form a first electrode along the first sidewall and to form a second electrode along the second sidewall. The first and second electrodes are electrically coupled with the first and second electrical contact regions, respectively. Programmable material is formed over the first and second electrodes. A top electrode is formed over the programmable material. A first memory cell comprises the first electrode together with the programmable material and the top electrode, and a second memory cell comprises the second electrode together with the programmable material and the top electrode. The programmable material within the first and second memory cells is a continuous strap across the first and second electrodes.

In some embodiments, the invention includes a method of forming a memory array. Spaced-apart lines of electrically insulative material are formed over a base. Each line has a pair of opposing sidewalls. The base has a plurality of spaced-apart electrical contact strips along an upper surface. The sidewalls of the lines are directly over upper surfaces of the electrical contact strips. Electrode material is deposited across the lines and across the spaces between the lines. The lines and strips are patterned into spaced-apart slices. The patterning divides the electrical contact strips into a plurality of contact regions, and divides the lines into electrically insulative projections. The electrode material is patterned into a plurality of bottom electrodes, with each bottom electrode being electrically coupled to a contact region. The bottom electrodes and electrically insulative projections are together comprised by paired-bottom-electrode structures having a single electrically insulative projection between a pair of bottom electrodes. Programmable material is formed over the paired-bottom-electrode structures. Top electrodes are formed over the programmable material. The top electrodes are in one-to-one correspondence with the paired-bottom-electrode structures. Individual memory cells of the memory array comprise a bottom electrode together with the programmable material and a top electrode.

In some embodiments, the invention includes a memory structure. A bottom electrode extends upwardly from a conductive contact to a programmable material. A top electrode is over the programmable material. The bottom electrode has a thickness of less than or equal to about 10 nanometers.

In some embodiments, the invention includes a memory array. A plurality of paired-cell structures each contains two memory cells and comprises an electrically insulative projection between a pair of bottom electrodes. Programmable material extends across both bottom electrodes, and a top electrode is over the programmable material and across both bottom electrodes. The paired-cell structures are over a base comprising conductive contacts. The conductive contacts are electrically coupled with the bottom electrodes. Each of the bottom electrodes has at least one segment which extends at angle of from greater than 30° to less than or equal to about 85° relative to a planar topography of the base. The top electrodes extend substantially parallel to the planar topography of the base and are in one-to-one correspondence with the paired-cell structures.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

I claim:

1. A method of forming a plurality of memory structures, comprising:
   forming a line of electrically insulative material over a base; the line having a first sidewall in opposing relation to a second sidewall; the base having a plurality of spaced-apart electrical contact regions along an upper surface; the first sidewall being directly over an upper surface of a first electrical contact region and the second sidewall being directly over a second electrical contact region;
   depositing electrode material over the line and along the sidewalls;
   patterning the electrode material to form a first electrode along the first sidewall and to form a second electrode along the second sidewall; the first and second electrodes being electrically coupled with the first and second electrical contact regions, respectively;
   forming programmable material over the first and second electrodes; and
   forming a top electrode over the programmable material; a first memory cell comprising the first electrode together with the programmable material and the top electrode, and a second memory cell comprising the second electrode together with the programmable material and the top electrode; the programmable material within the first and second memory cells being a continuous strap across the first and second electrodes.

2. The method of claim 1 wherein:
   the base comprises buried wordlines;
   the electrical contact regions are source/drain regions paired with individual buried wordlines to form transistors; and
   the first electrical contact region is comprised by a first transistor, and the second electrical contact region is comprised by a second transistor adjacent the first transistor.

3. The method of claim 1 wherein the sidewalls are substantially orthogonal relative to a planar topography of the base.

4. The method of claim 1 wherein the sidewalls are at an angle of from greater than 30° to less than or equal to about 85° relative to a planar topography of the base.

5. The method of claim 1 wherein each of the first and second sidewalls comprises at least two angled segments between a planar topography of the base and a top surface of the line.

6. The method of claim 1 wherein the electrode material comprises titanium nitride.

7. The method of claim 1 wherein the first and second electrodes have thicknesses of less than or equal to about 10 nanometers.

8. The method of claim 1 wherein the memory cells are RRAM cells.

9. A method of forming a memory array, comprising:
   forming spaced-apart lines of electrically insulative material over a base; each line having a pair of opposing sidewalls; the base having a plurality of spaced-apart electrical contact strips along an upper surface; the sidewalls of the lines being directly over upper surfaces of the electrical contact strips;
   depositing electrode material across the lines and across spaces between the lines;
   patterning the lines and strips into spaced-apart slices; the patterning dividing the electrical contact strips into a plurality of contact regions, and dividing the lines into electrically insulative projections;
   patterning the electrode material into a plurality of bottom electrodes, with each bottom electrode being electrically coupled to a contact region; the bottom electrodes and electrically insulative projections being together comprised by paired-bottom-electrode structures having a single electrically insulative projection between a pair of bottom electrodes;
   forming programmable material over the paired-bottom-electrode structures; and
   forming top electrodes over the programmable material; the top electrodes being in one-to-one correspondence with the paired-bottom-electrode structures; individual memory cells of the memory array comprising a bottom electrode together with the programmable material and a top electrode.

10. The method of claim 9 further comprising:
    forming electrically insulative material over and between the spaced-apart slices;
    forming a planarized surface extending across the paired-cell structures and the electrically insulative material; and
    forming the programmable material over the planarized surface.

11. The method of claim 9 wherein the programmable material is formed as a plurality of separate programmable material straps, and wherein each strap is across only a single paired-bottom-electrode structure.

12. The method of claim 9 wherein the programmable material is formed as a continuous expanse extending across multiple paired-bottom-electrode structures.

13. The method of claim 9 wherein:
    the base comprises buried wordlines;
    the electrical contact regions are source/drain regions paired with individual buried wordlines to form transistors; and
    individual paired-bottom electrode structures have a first bottom electrode and a second bottom electrode, with the first bottom electrode being connected to a source/drain region of a different transistor than the second bottom electrode.

14. The method of claim 9 wherein the sidewalls of the lines are substantially orthogonal relative to a planar topography of the base.

15. The method of claim 9 wherein the sidewalls of the lines are at an angle of from greater than or equal to about 45° to less than or equal to about 60° relative to a planar topography of the base.

16. The method of claim 9 wherein each of the sidewalls of the lines comprises at least two segments having different angles than one another relative to a planar topography of the base.

17. The method of claim 9 wherein the memory cells are RRAM cells.

* * * * *